United States Patent
Choi

(10) Patent No.: US 9,598,255 B2
(45) Date of Patent: Mar. 21, 2017

(54) APPARATUS FOR RECEIVING AND DISCHARGING MATERIAL SUCH AS WASTE VINYL

(71) Applicant: HANWHA TECHWIN CO., LTD., Changwon-Si (KR)

(72) Inventor: Hyung-Soo Choi, Seongnam-si (KR)

(73) Assignee: Hanwha Techwin Co., Ltd., Changwon-si (KR)

( * ) Notice: Subject to any disclaimer, the term of this patent is extended or adjusted under 35 U.S.C. 154(b) by 230 days.

(21) Appl. No.: 14/535,980

(22) Filed: Nov. 7, 2014

(65) Prior Publication Data

US 2015/0056047 A1    Feb. 26, 2015

Related U.S. Application Data

(62) Division of application No. 13/328,356, filed on Dec. 16, 2011, now abandoned.

(30) Foreign Application Priority Data

Dec. 21, 2010   (KR) .................. 10-2010-0131514

(51) Int. Cl.
  *B65H 20/32* (2006.01)
  *B65G 65/32* (2006.01)
  (Continued)

(52) U.S. Cl.
  CPC .............. *B65H 20/32* (2013.01); *B65G 65/32* (2013.01); *H05K 13/021* (2013.01); *B65H 20/22* (2013.01)

(58) Field of Classification Search
  CPC ........ B65H 20/22; B65H 20/32; H05K 13/02; H05K 13/021; B65G 65/32
  See application file for complete search history.

(56) References Cited

U.S. PATENT DOCUMENTS

| 8,291,580 B2 | 10/2012 | Lee |
| 2008/0035697 A1 | 2/2008 | Kim |
| 2010/0101079 A1 | 4/2010 | Lee |

FOREIGN PATENT DOCUMENTS

| JP | 2002299887 A | 10/2002 |
| JP | 2003188584 A | 7/2003 |

(Continued)

OTHER PUBLICATIONS

Communication dated Oct. 16, 2015 issued by the Korean Intellectual Property Office in counterpart Korean Patent Application No. 10-2010-0131514 English Translation.

(Continued)

*Primary Examiner* — William E Dondero
(74) *Attorney, Agent, or Firm* — Sughrue Mion, PLLC

(57) ABSTRACT

Provided is an apparatus for disposing a material such as waste vinyl, which is configured to collect and dispose of the material on a constant quantity basis. The apparatus includes a receiving part which receives a material supplied from an outside; a supply part, provided at an end of the receiving part, through which the material is supplied to the receiving part; a door part provided at another end of the receiving part and configured to be opened to the outside; and a fixing part formed at a location adjacent to the door part and maintaining the receiving part in a closed state until an internal pressure of the receiving part reaches a predetermined pressure level, wherein the door part is opened to discharge the material to the outside if the internal pressure of the receiving part exceeds the predetermined pressure level.

16 Claims, 5 Drawing Sheets

(51) Int. Cl.
*H05K 13/02* (2006.01)
*B65H 20/22* (2006.01)

(56) References Cited

FOREIGN PATENT DOCUMENTS

| | | |
|---|---|---|
| JP | 2003243886 A | 8/2003 |
| JP | 2003273579 A | 9/2003 |
| KR | 10-2009-0083221 A | 8/2009 |
| KR | 10-2010-0047539 A | 5/2010 |

OTHER PUBLICATIONS

Communication dated Jul. 1, 2016 issued by the Korean Intellectual Property Office in counterpart Korean Patent Application No. 10-2010-0131514 English Translation.

APPARATUS FOR RECEIVING AND DISCHARGING MATERIAL SUCH AS WASTE VINYL

CROSS-REFERENCE TO RELATED APPLICATION

This is a Divisional of application Ser. No. 13/328,356 filed Dec. 16, 2011, which claims priority from Korean Patent Application No. 10-2010-0131514 filed on Dec. 21, 2010 in the Korean Intellectual Property Office, the disclosure of which is incorporated herein in its entirety by reference.

BACKGROUND

1. Field

Apparatuses consistent with exemplary embodiments relate to an apparatus of receiving and discharging a material, and more particularly, to an apparatus or receiving and discharging waste vinyl on a constant quantity basis.

2. Description of the Related Art

In general, a mounter for mounting components is usually used in automatically mounting electronic components, such as semiconductor chips, condensers or resistors, on a printed circuit board (PCB).

A tray feeder or a tape feeder may be used to supply components to the mounter. The components to be mounted on the PCB are transferred to a component pick-up position of the mounter under the control of a controller provided in the feeder, and the mounter picks up the transferred components in a predefined order to mount the picked up components on the PCB.

An electronic component supply apparatus, such as a feeder used in a mounter for mounting components, continuously supplies the components. Surfaces of the components to be mounted are coated with a material, such as vinyl, for protecting the components before the components are mounted, and the protecting material such as vinyl is peeled off immediately before the components are supplied to the mounter to be supplied to the mounter.

One method for disposing of waste vinyl peeled off from the component supply apparatus is to roll up the waste vinyl on a constant quantity basis to collectively dispose of the waste vinyl. Another method for disposing of waste vinyl peeled off from the component supply apparatus is to discharge waste vinyl downward or rearward with respect to the component supply apparatus in an endless discharge manner.

In the waste vinyl disposal system, the waste vinyl is exposed to the outside, which may create unpleasing external appearance in working conditions. In particular, in the latter case, since the waste vinyl is continuously discharged, it is necessary for an operator to stay at a waste vinyl outlet to perform a waste vinyl disposal operation without interruption, which requires an unnecessary labor force and increases manufacturing costs. SUMMARY One or more exemplary embodiments are provided to address the foregoing problems, and an object of the these exemplary embodiments is to provide an apparatus for disposing of waste vinyl, which can improve external appearance in working conditions by receiving the waste vinyl in a predetermined space and automatically discharging on a constant quantity basis to allow an operator to dispose of the discharged waste vinyl, and can reduce an operator's working time required for the operator to perform a waste vinyl disposal operation.

One or more exemplary embodiments also provide an apparatus for disposing of waste vinyl, which includes a pressure transmitting part, which can prevent waste vinyl from flowing backward due to an abnormal increase in an internal pressure of a predetermined space for receiving the waste vinyl when the waste vinyl is received in the predetermined space, thereby enhancing reliability in a waste vinyl disposal operation.

Although the exemplary embodiments described in detail in the present application are directed to an apparatus for disposing of waste vinyl, the inventive concept is not limited thereto.

According to an aspect of an exemplary embodiment, there is provided an apparatus of receiving and discharging a material, the apparatus including a receiving part which receives a material supplied from an outside; a supply part which is provided at an end of the receiving part, through which the material is supplied to the receiving part; a door part which is provided at another end of the receiving part and configured to be opened to the outside;

and a fixing part which is provided at a location adjacent to the door part and maintains the receiving part in a closed state until an internal pressure of the receiving part reaches a predetermined pressure level, wherein the door part is opened to discharge the material to the outside if the internal pressure of the receiving part exceeds the predetermined pressure level.

The apparatus for disposing waste vinyl may further include a pressure transmitting part provided at one side of the receiving part and configured to be shifted by the internal pressure of the receiving part so that one end of the pressure transmitting part to contact the door part to open the door part to the outside.

BRIEF DESCRIPTION OF THE DRAWINGS

The above and other aspects will become more apparent by describing in detail exemplary embodiments with reference to the attached drawings, in which.

DETAILED DESCRIPTION OF THE EXEMPLARY EMBODIMENTS

Figure 1:
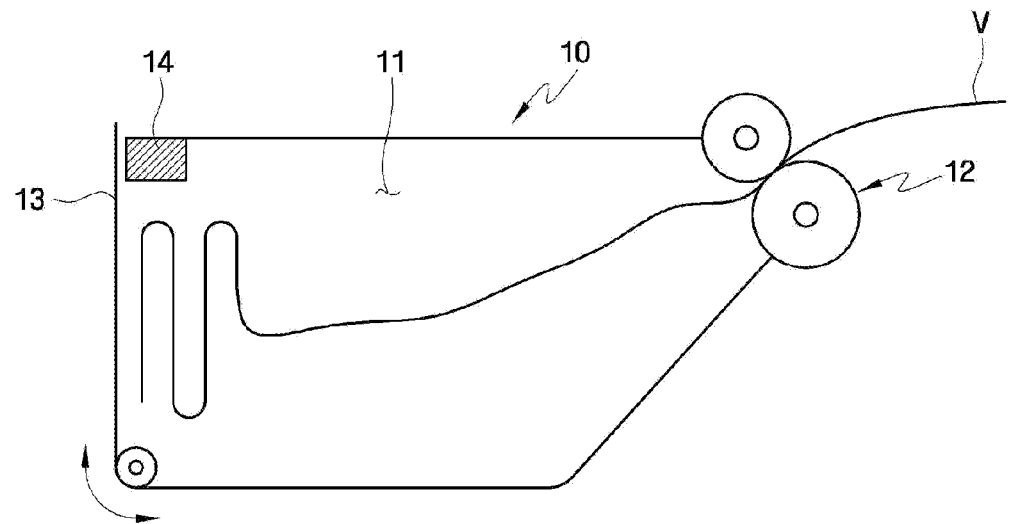
FIG. 1 is a schematic diagram of an apparatus for disposing of waste vinyl according to an exemplary embodiment.

The inventive concept may be understood more readily by reference to the following detailed description of exemplary embodiments and the accompanying drawings. The inventive concept may, however, be embodied in many different forms and should not be construed as being limited to the embodiments set forth herein. Rather, these embodiments are provided so that this disclosure will be thorough and complete and will fully convey the inventive concept to those skilled in the art, and the inventive concept will only be defined by the appended claims. In the drawings, the thickness of layers and regions are exaggerated for clarity.

As used herein, the singular forms "a", "an" and "the" are intended to include the plural forms as well, unless the context clearly indicates otherwise. It will be further understood that the terms "comprises" and/or "made of," when used in this specification, specify the presence of stated features, integers, steps, operations, elements, and/or components, but do not preclude the presence or addition of one or more other features, integers, steps, operations, elements, components, and/or groups thereof. Like numbers refer to like elements throughout.

Spatially relative terms, such as "below," "beneath," "lower," "above," "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures.

Figure 2:
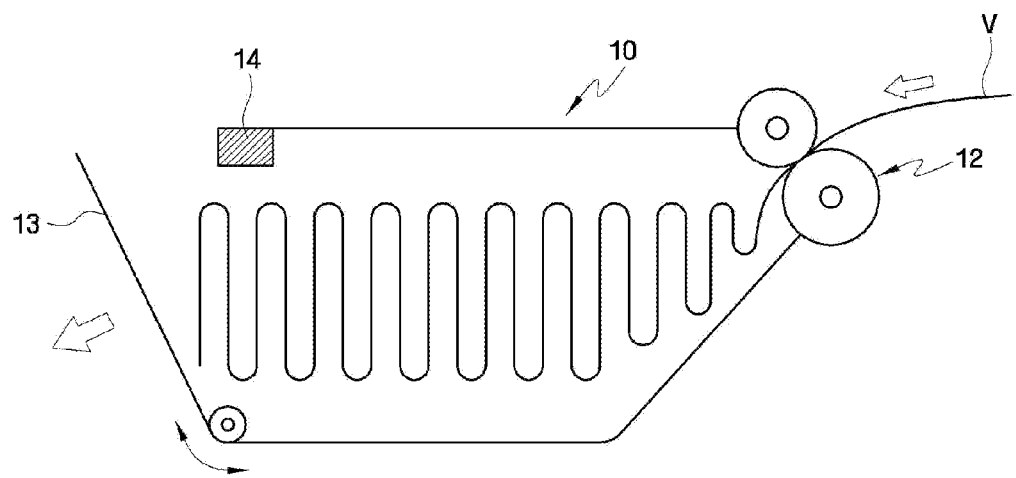
FIG. 2 illustrates that a door part is automatically opened to discharge waste vinyl on a constant quantity basis when greater than a predetermined quantity of waste vinyl is received in the apparatus for disposing of waste vinyl shown in FIG. 1, according to an exemplary embodiment.
Figure 3:
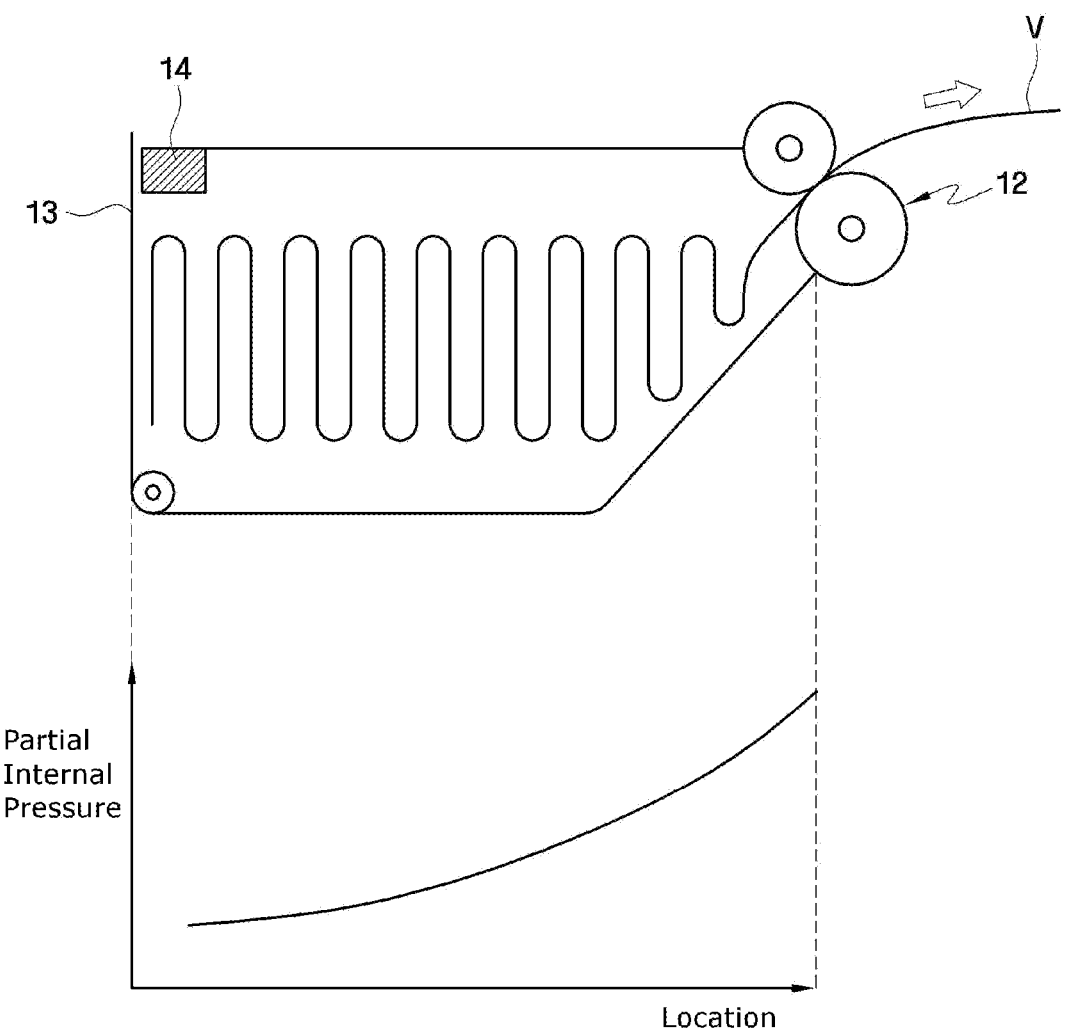
FIG. 3 illustrates an operation failure occurring when a door part is not opened even with an increase in the internal pressure of the apparatus for disposing of waste vinyl shown in FIG. 1, according to an exemplary embodiment.

Hereinafter, an apparatus for disposing of waste vinyl according to an exemplary embodiment will be described with reference to FIGS. 1 to 3. FIG. 1 is a schematic diagram of an apparatus for disposing of waste vinyl according to an exemplary embodiment, FIG. 2 illustrates that a door part is automatically opened to discharge waste vinyl on a constant quantity basis when greater than a predetermined quantity of waste vinyl is received in the apparatus for disposing of waste vinyl shown in FIG. 1, and FIG. 3 illustrates an operation failure occurring when a door part is not opened even with an increase in the internal pressure of the apparatus for disposing of waste vinyl shown in FIG. 1.

The waste vinyl disposal apparatus 10 according to an exemplary embodiment includes a receiving part 11 having an empty space to receive the waste vinyl V, a supply part 12 provided at an end of the receiving part 11 and supplying the waste vinyl V to the receiving part 11, a door part 13 provided at the other end of the receiving part 11 and configured to be opened to the outside along a rotation shaft, and a fixing part 14 formed at a location adjacent to the door part 13. The fixing part and the door part 13 are configured to maintain the receiving part 11 in a closed state until an internal pressure of the receiving part 11 reaches a predetermined pressure level.

Referring to FIG. 1, the receiving part 11 is an empty space to receive the waste vinyl V and is configured to open the door part 13 by pressing the door part 13 to the outside by the internal pressure as the internal pressure gradually increases. Therefore, the receiving part 11 may be a sealed space so as to increase the internal pressure to be maintained at a constant level.

The supply part 12 is formed at the end of the receiving part 11. The supply part 12 supplies the waste vinyl V to the receiving part 11. The supply part 12 may include a pair of rollers meshed with each other and rotating so as to supply the waste vinyl V to the inside of the receiving part 11 while maintaining a sealed state of the receiving part 11. Therefore, while the receiving part 11 is maintained insulated from the outside, it may supply the waste vinyl V to the inside of the receiving part 11.

The door part 13 is formed at the other end of the receiving part 11. The door part 13 is provided to be opened to the outside along the rotation shaft. If greater than the constant quantity of waste vinyl V is supplied to the inside of the receiving part 11, the internal pressure of the receiving part 11 is increased by the waste vinyl V, by which the door part 13 is opened to the outside, as shown in FIG. 2, so that a pile of waste vinyl V may be discharged at the same time. The operator can easily process the pile of waste vinyl V discharged on a constant quantity basis for a predetermined time. Since the door part 13 is closed in other times in which waste vinyl V is not discharged, the operator may perform another operating work while the waste vinyl V is not discharged, thereby increasing working efficiency.

The door part 13 is and the fixing part 14 are configured to maintain the receiving part at a closed state, and, when the internal pressure exceeds the predetermined level, it is opened to the outside because a force of opening the door part 13 to the outside exceeds a force of fixing the door part to the fixing part 14. As shown in FIG. 1, the fixing part 14 is formed at a location adjacent to one side of the door part 13.

The receiving part 11 should be maintained at the closed state until the internal pressure reaches the predetermined level, and then, be opened when the internal pressure exceeds the predetermined level. Thus, the fixing part 14 may be formed of, for example, a magnetic material, so as to fix the door part 13 with a uniform force corresponding to the internal pressure. That is, the receiving part 11 is maintained at the closed state due to an attraction applied between the fixing part 14 and a metal support formed at one side of the door part 13, and when the internal pressure becomes greater than the attraction, the door part 13 may be opened to the outside over the attraction. In the illustrated embodiment, the fixing part 14 is formed at a location spaced apart from the rotation shaft of the door part 13, but aspects of the inventive concept are not limited thereto.

As described above, if the door part 13 is opened to the outside, the pile of waste vinyl V is discharged on a constant quantity basis at the same time. The operator easily treats the discharged pile of waste vinyl V for a predetermined time, and the door part 13 is again closed to allow the receiving part 11 to receive again the waste vinyl V.

Referring to FIG. 3, in this embodiment, opening or closing of the door part 13 depends only on the internal pressure of the receiving part 11. However, as shown, when internal pressures of the receiving part 11 are different between the door part 13 and the supply part 12, the internal pressure of the receiving part 11 may not be properly transmitted to the door part 13.

That is, since a pressure from the waste vinyl V is applied in only one direction, the pressure may not be sufficiently transmitted to the door part 13 according to the direction and shape of the waste vinyl V piled in the receiving part 11.

Thus, the door part 13 is not opened but the pressure of the supply part 12 gradually increases. Accordingly, the waste vinyl V is highly likely to get jammed or to flow backward.

In particular, since there is a big difference in the pressure transmitted to the door part 13 relative to the quantity of waste vinyl V piled in the receiving part 11 according to the type and adhesion of the waste vinyl V, the weather or the humidity, there may be a problem that the door part 13 is not opened even if the quantity of waste vinyl V exceeds a predetermined level of quantity to be received.

Figure 4:
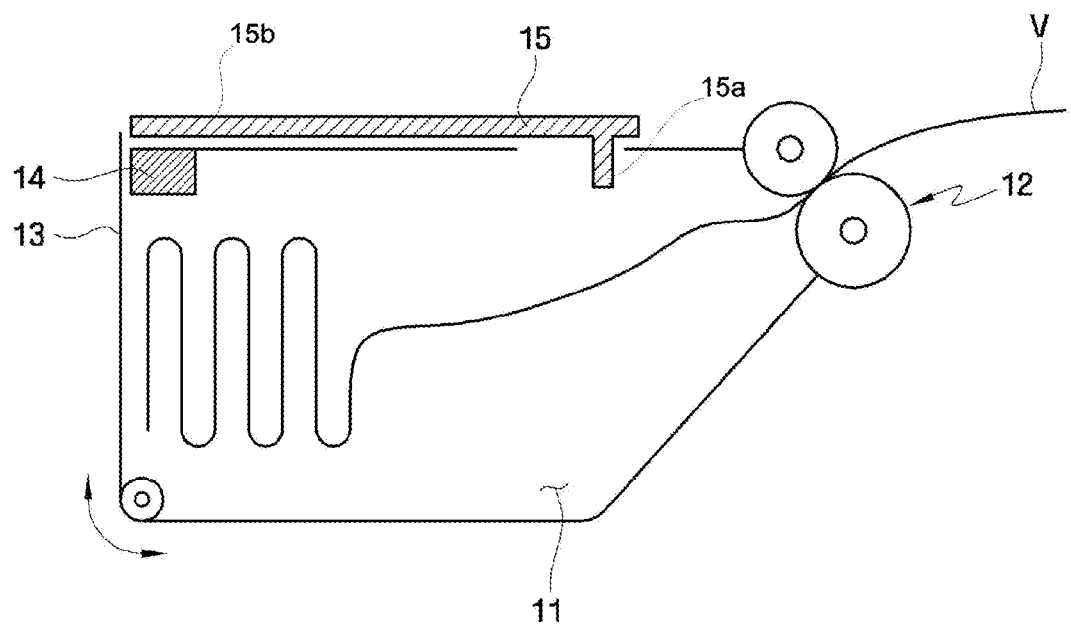
FIG. 4 is a schematic diagram of an apparatus for disposing of waste vinyl, according to another exemplary embodiment.
Figure 5:
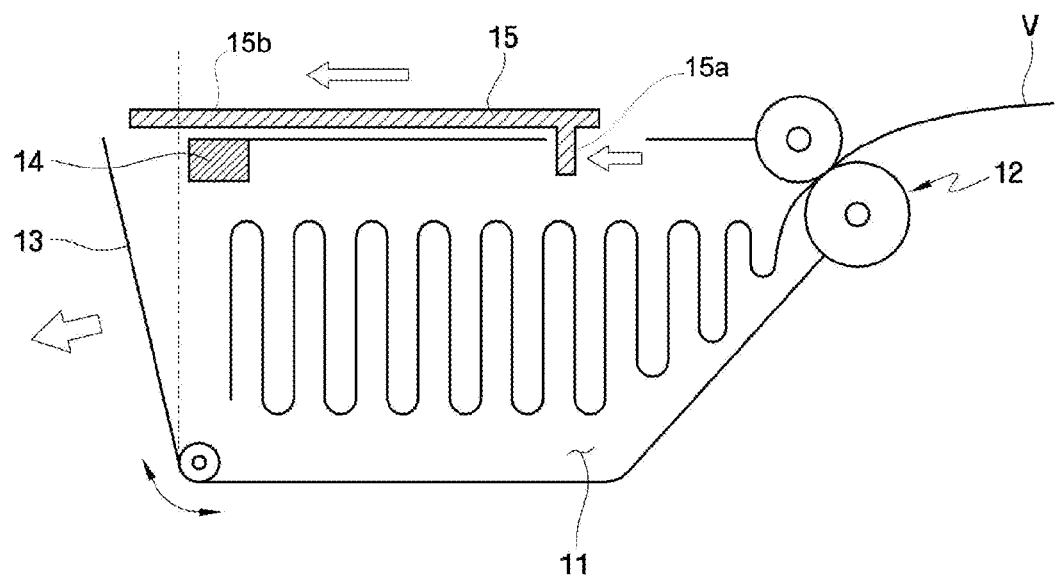
FIG. 5 illustrates operating mechanism depending on an increase in the internal pressure of the apparatus for disposing of waste vinyl shown in FIG. 4, according to still another exemplary embodiment.

Thus, in case where the door part 13 is not opened, an auxiliary component may become necessary, which will be described in detail with reference to FIGS. 4 and 5. FIG. 4 is a schematic diagram of an apparatus for disposing of waste vinyl according to another exemplary embodiment, and FIG. 5 illustrates operating mechanism depending on an increase in the internal pressure of the apparatus for disposing of waste vinyl shown in FIG. 4.

The waste vinyl disposal apparatus 10 includes a receiving part 11 having an empty space to receive the waste vinyl V, a supply part 12 provided at an end of the receiving part 11 and supplying the waste vinyl V to the receiving part 11, a door part 13 provided at the other end of the receiving part 11 and configured to be opened to the outside along a rotation shaft, a fixing part 14 formed at a location adjacent to the door part 13 to maintain the receiving part 11 in a closed state until an internal pressure of the receiving part 11 reaches a predetermined pressure level, and a pressure transmitting part 15 provided at one side of the receiving part 11 and including a pressure sensing unit 15a provided adjacent to the supply part 12 and a pressing unit 15b provided adjacent to the door part 13. The pressure sensing unit 15a is shifted by the internal pressure of the receiving part 11, and the pressing unit 15b is moved to the door part 13 by the pressure sensing unit 15a to press the door part 13 to the outside, thereby allowing the door part 13 to be opened.

Unlike in the previous embodiment, the waste vinyl disposal apparatus according to this embodiment may further include the pressure transmitting part 15. That is, the pressure transmitting part 15, which is formed at one side of the receiving part 11 and has one end positioned adjacent to the door part 13, senses the internal pressure of the receiving part 11 and is configured to move in a lengthwise direction of the receiving part 11 by the internal pressure of the receiving part 11.

As shown in FIG. 4, when the quantity of waste vinyl V received in the receiving part 11 is less than a predetermined quantity, the internal pressure of the receiving part 11 is maintained at the predetermined level or less, so that the pressure transmitting part 15 is not moved toward the door part 13. In this case, as described above, the fixing part 14 keeps the door part 13 at a closed state.

However, as shown in FIG. 5, when the quantity of waste vinyl V received in the receiving part 11 is greater than a predetermined quantity, the internal pressure of the receiving part 11 increases to a predetermined level or higher, so that the pressure transmitting part 15 is moved toward the door part 13 and pushes the door part 13 away to the outside. Here, a force of fixing the door part 13 to the fixing part 14 is greater than a force applied to the door part 13 to the outside by the internal pressure of the receiving part 11. Since, however, a sum of the force applied to the door part 13 to the outside by the internal pressure of the receiving part 11 and a force applied to the door part 13 by the pressure transmitting part 15 pressing the door part 13 to the outside is greater than the force of fixing the door part 13 to the fixing part 14, the door part 13 may be opened to the outside.

The pressure sensing unit 15a is configured to protrude toward the inside of the receiving part 11 so as to sense the internal pressure of the receiving part 11. That is, the pressure sensing unit 15a shaped of a protrusion is pressed toward the door part 13 by the internal pressure of the receiving part 11.

The pressing unit 15b is connected to the pressure sensing unit 15a and extends in one direction to be positioned adjacent to the door part 13. Therefore, if the pressure sensing unit 15a is pressed toward the door part 13, the pressing unit 15b is also pressed toward the door part 13, thereby allowing the door part 13 to be opened.

The pressure transmitting part 15, specifically, the pressure sensing unit 15a may be formed adjacent to the supply part 12 in the receiving part 11. That is, as described above, when the internal pressure of the receiving part 11 is not uniformly maintained, the internal pressure tends to increase toward the supply part 12. Since the internal pressure is not directly transmitted to the door part 13, the door part 13 may not be opened even if the partial internal pressure of the receiving part 11 positioned adjacent to the supply part 12 is greatly increased.

Therefore, in a case where the pressure sensing unit 15a is formed adjacent to the supply part 12 in the receiving part 11 to make the door part 13 opened, a high internal pressure of the receiving part 11 may be transmitted to the door part 13 through the pressing unit 15b. Therefore, even if the internal pressure around the door part 13 is maintained at the predetermined level or less, the door part 13 may be opened when the partial internal pressure of the receiving part 11 positioned adjacent to the supply part 12 becomes greater than or equal to the predetermine level.

Accordingly, abnormalities occurring when the door part 13 is not opened due to non-uniform distribution in the internal pressure, such as jamming or backward flow of the waste vinyl V, may be avoided.

The inventive concept does not limit the configuration of the pressure transmitting part 15 to the exemplary embodiment illustrated herein, and the pressure sensing unit 15a and the pressing unit 15b may be integrally formed. The pressure sensing unit 15a may be formed of a thin and wide panel so as to allow the internal pressure to be easily transmitted to the door part 13. In addition, the pressing unit 15b may be shaped of a pipe capable of pressing the door part 13 to the outside. In addition, the pressure sensing unit 15a and the pressing unit 15b may be formed in a combination of a piston and a cylinder, a piston and a rod, or the like.

Figure 6:
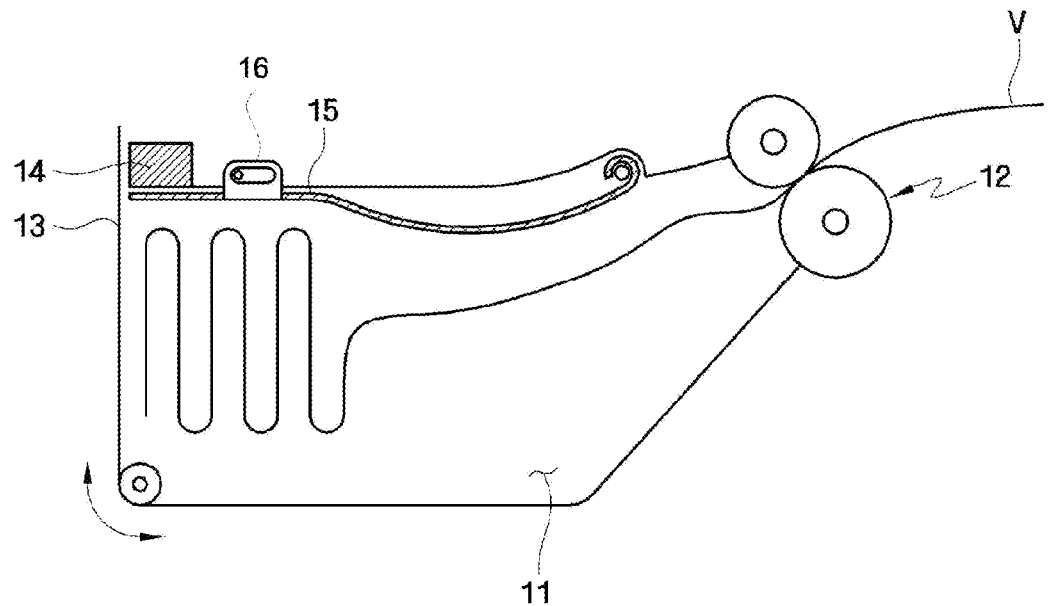
FIG. 6 is a schematic diagram of an apparatus for disposing of waste vinyl, according to still another exemplary embodiment.
Figure 7:
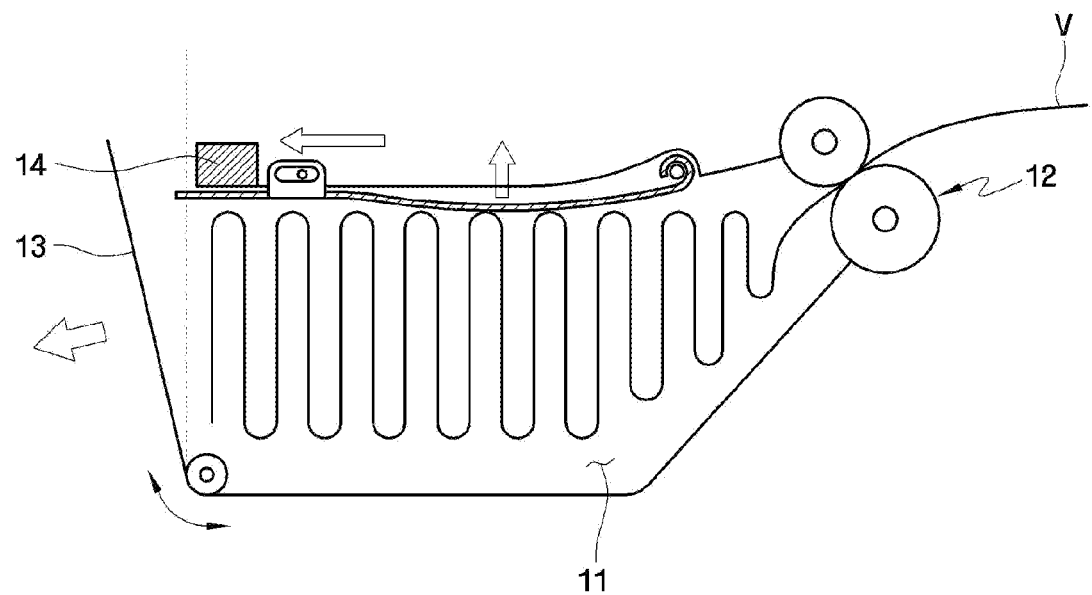
FIG. 7 illustrates operating mechanism depending on an increase in the internal pressure of the apparatus for disposing of waste vinyl shown in FIG. 6, according to still another exemplary embodiment.

Hereinafter, an apparatus for disposing of waste vinyl according to still another exemplary embodiment of the present invention will be described with reference to FIGS. 6 and 7. FIG. 6 is a schematic diagram of an apparatus for disposing of waste vinyl according to still another exemplary embodiment of the present invention and FIG. 7 illustrates operating mechanism depending on an increase in the internal pressure of the apparatus for disposing of waste vinyl shown in FIG. 6.

Like in the previous embodiment, the waste vinyl disposal apparatus according to this embodiment includes a pressure transmitting part 15. However, the pressure transmitting part 15 according to this embodiment operates in a different manner than in the previous embodiment. That is to say, the pressure transmitting part 15 may be an elastic member that senses a pressure and has a length varying in a lengthwise direction.

In detail, the pressure transmitting part 15 is provided at one side of the receiving part 11, and has one end fixed to one surface of the receiving part 11 and the other end positioned adjacent to the door part 13. Here, a hinge part 16 may be provided at the end of the pressure transmitting part 15 adjacent to the door part 13. The hinge part 16 may be connected to the pressure transmitting part 15, and may guide a movement direction of the pressure transmitting part 15 due to elastic deformation.

The pressure transmitting part 15 may have a convex section protruding toward an internal space of the receiving part 11.

The internal space of the receiving part 11 is filled with waste vinyl V. If the internal space of the receiving part 11 is filled with greater than a predetermined quantity of waste vinyl V, a pressure of the internal space increases and the waste vinyl V presses the convex section of the pressure transmitting part 15. Since the pressure transmitting part 15 is formed of an elastic member, when a pressure of a predetermined level or greater is applied to the pressure transmitting part 15, a protruding height of the convex section may be reduced. Since the one end of the pressure transmitting part 15 is fixed, the pressure transmitting part 15 is elongated in the lengthwise direction toward the door part 13 by a length corresponding to the protruding height of the convex section, so that the other end of the pressure transmitting part 15 is moved toward the door part 13.

Deformation of the pressure transmitting part 15 gradually increases and the pressure transmitting part 15 continuously presses the door part 13. Then, if a sum of a force applied to the door part 13 to the outside by the internal pressure of the receiving part 11 and a force applied to the door part 13 by the pressure transmitting part 15 pressing the door part 13 to the outside exceeds a force of fixing the door part 13 to the fixing part 14, the door part 13 is opened to the outside, as shown in FIG. 7.

Therefore, even if the internal pressure around the door part 13 is maintained at the predetermined level or less, the door part 13 may be opened when the internal pressure applied to the pressure transmitting part 15 exceeds the predetermined level. Accordingly, abnormalities, such as jamming or backward flow of the waste vinyl V, occurring when the door part 13 is not opened due to non-uniform distribution in the internal pressure may be avoided.

Figure 8:
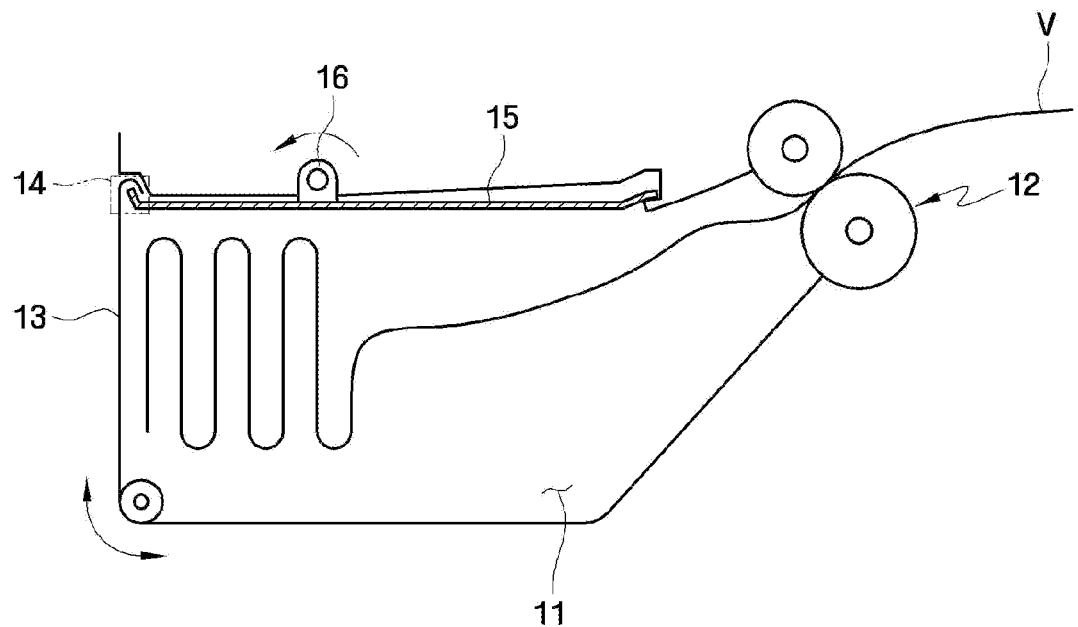
FIG. 8 is a schematic diagram of an apparatus for disposing of waste vinyl, according to still another exemplary embodiment.

Hereinafter, an apparatus for disposing of waste vinyl according to still another exemplary embodiment will be described with reference to FIGS. 8 and 9. FIG. 8 is a schematic diagram of an apparatus for disposing of waste vinyl according to still another exemplary embodiment of the present invention, and FIG. 9 illustrates operating mechanism depending on an increase in the internal pressure of the apparatus for disposing of waste vinyl shown in FIG. 8.

Like in the previous embodiment, the waste vinyl disposal apparatus according to this embodiment includes a pressure transmitting part 15. However, the pressure transmitting part 15 according to this embodiment operates in a different manner than in the previous embodiment, and a door part 13 is fixed by a fixing part 14 in a different manner than in the previous embodiment.

That is, the pressure transmitting part 15 is fixed to one surface of the receiving part 11 by a hinge part 16 around the center thereof, and is rotatably installed about the hinge part 16. An end of the pressure transmitting part 15 positioned adjacent to the door part 13 is bent in a predetermined direction and is in mesh with an end of the door part 13, forming the fixing part 14.

Figure 9:
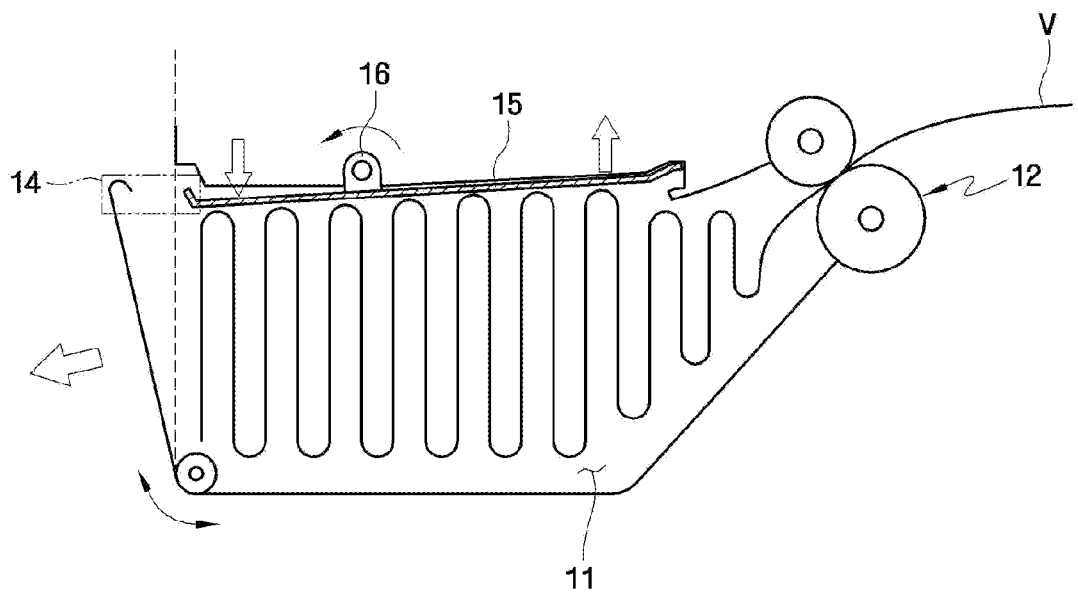
FIG. 9 illustrates operating mechanism depending on an increase in the internal pressure of the apparatus for disposing of waste vinyl shown in FIG. 8, according to still another exemplary embodiment.

As shown in FIG. 9, if waste vinyl V is piled up in an internal space of the receiving part 11, an internal pressure of the receiving part 11 increases, and a bottom surface of the rotatably installed pressure transmitting part 15 is pressed by the internal pressure. The pressed pressure transmitting part 15 rotates about the hinge part 16. If the pressure transmitting part 15 is rotated by a predetermined length or longer, one end of the pressure transmitting part 15 and one end of the door part 13, which form the fixing part 14, are separated from each other to allow the door part to be opened to the outside.

To this end, with respect to the hinge part 16, a first region of the pressure transmitting part 15 (a left portion in FIG. 8) is brought into close contact with one surface of the receiving part 11 (a top portion in FIG. 8) and a second region of the pressure transmitting part 15 (a right portion in FIG. 8) is spaced apart from the one surface of the receiving part 11 (the top portion in FIG. 8). The pressure transmitting part 15 in the second region is provided to be rotatable toward one surface of the receiving part 11 (counterclockwise in FIGS. 8 and 9.

Therefore, even if the internal pressure around the door part 13 is maintained at a predetermined level or less, the door part 13 may be opened when the internal pressure around the supply part 12 is greater than or equal to the predetermine level. Accordingly, abnormalities occurring when the door part 13 is not opened due to non-uniform distribution in the internal pressure, such as jamming or backward flow of the waste vinyl V, may be avoided.

While the inventive concept has been particularly shown and described with reference to exemplary embodiments, it will be understood by those of ordinary skill in the art that various changes in form and details may be made therein without departing from the spirit and scope of the inventive concept as defined by the following claims. For example, the apparatuses described in the exemplary embodiments may not be limited to only those apparatuses disposing of waste vinyl. It is therefore desired that the exemplary embodiments be considered in all respects as illustrative and not restrictive, reference being made to the appended claims rather than the foregoing description to indicate the scope of the inventive concept.

What is claimed is:

1. 1. An apparatus of receiving and discharging a material, the apparatus comprising:
   a receiving part which receives a material supplied from outside;
   a supply part which is provided at an end of the receiving part and through which the material is supplied to the receiving part;
   a door part which is provided at another end of the receiving part and configured to be opened to the outside;
   a fixing part which is provided at a location adjacent to the door part and maintains the receiving part in a closed state until an internal pressure of the receiving part reaches a predetermined pressure level; and
   a pressure transmitting part which is provided at one side of the receiving part and configured to be shifted by the internal pressure of the receiving part so that one end of the pressure transmitting part to contact the door part to open the door part to the outside,
   wherein the pressure transmitting part comprises:
   a pressure sensing unit which is provided adjacent to the supply part and is configured to protrude toward the inside of the receiving part so as to sense the internal pressure of the receiving part; and a pressing unit which is provided adjacent to the door part, is connected to the pressure sensing unit and is configured to contact the door part to open the door part to the outside if a sum of a force applied to the door part to the outside by the internal pressure of the receiving part and a force applied to the door part by the pressure transmitting part pressing the door part to the outside is greater than a force of fixing the door part to the fixing part.

2. The apparatus of claim 1, wherein the pressure sensing unit is shifted by the internal pressure of the receiving part, and the pressing unit is moved to the door part by the pressure sensing unit to press the door part to the outside and to allow the door part to be opened.

3. The apparatus of claim 1, wherein the door part is opened to discharge the portion of the material if a sum of a force applied to the door part to the outside by the internal pressure of the receiving part and a force applied to the door part by the pressure transmitting part pressing the door part to the outside is greater than a force of fixing the door part to the fixing part.

4. The apparatus of claim 1, wherein the internal pressure of the receiving part becomes higher at around the supply part than at around the door part when a quantity of the material received at the receiving part increases.

5. The apparatus of claim 1, wherein the fixing part is configured to be fixed to the door part in the closed state.

6. The apparatus of claim 1, wherein the material received and discharged is a substantially flat, flexible and continuously received material.

7. The apparatus of claim 1, wherein the pressure sensing unit comprises an elastic member elastically deformed by the internal pressure and is configured to convexly protrude toward the inside of the receiving part.

8. The apparatus of claim 7, wherein the pressure sensing unit is elongated in the lengthwise direction toward the door part, and the pressing unit is connected to the pressure sensing unit, is moved to the door part by the pressure sensing unit to press the door part to the outside and to allow the door part to be opened.

9. The apparatus of claim 7, further comprising a hinge part which is connected to the pressing unit, provided around the door part of the pressing unit and guides a movement direction of the pressing unit due to elastic deformation of the pressure sensing unit.

10. An apparatus of receiving and discharging a material, the apparatus comprising:
a container which receives the material, and contains the material until a quantity of the material contained in the container reaches a predetermined amount or an internal pressure of the container reaches a predetermined level,
wherein the container comprises;
a fixing part;
a door part contacting the fixing part; and
a pressure transmitting part which is provided at one side of the container and configured to be shifted by the internal pressure of the container so that one end of the pressure transmitting part to contact the door part to open the door part to the outside,
wherein if the quantity of the material contained in the container reaches the predetermined amount or the internal pressure of the container reaches the predetermined level, the fixing part and the door part are configured to be separated from each other to discharge a portion of the material,
wherein the pressure transmitting part comprises:
a pressure sensing unit which is provided adjacent to an input portion of the container through which the material is received and is configured to protrude toward the inside of the container so as to sense the internal pressure of the container; and
a pressing unit which is provided adjacent to the door part, is connected to the pressure sensing unit and is configured to contact the door part to open the door part to the outside if a sum of a force applied to the door part to the outside by the internal pressure of the container and a force applied to the door part by the pressure transmitting part pressing the door part to the outside is greater than a force of fixing the door part to the fixing part.

11. The apparatus of claim 10, wherein the door part is opened to discharge the portion of the material if a sum of a force applied to the door part to the outside by the internal pressure of the container and a force applied to the door part by the pressure transmitting part pressing the door part to the outside is greater than a force of fixing the door part to the fixing part.

12. The apparatus of claim 10, wherein the internal pressure of the container becomes higher at around a portion of the container, through with the material is received, than at around the door part when a quantity of the material received at the container increases.

13. The apparatus of claim 10, wherein the material received and discharged is a substantially flat, flexible and continuously received material.

14. The apparatus of claim 10, wherein the pressure sensing unit comprises an elastic member elastically deformed by the internal pressure and is configured to convexly protrude toward the inside of the container.

15. The apparatus of claim 14, wherein the pressure sensing unit is elongated in the lengthwise direction toward the door part, and the pressing unit is connected to the pressure sensing unit, is moved to the door part by the pressure sensing unit to press the door part to the outside and to allow the door part to be opened.

16. The apparatus of claim 14, further comprising a hinge part which is connected to the pressing unit, provided around the door part of the pressing unit and guides a movement direction of the pressing unit due to elastic deformation of the pressure sensing unit.

* * * * *